United States Patent [19]
Goodwin

[11] Patent Number: 6,164,980
[45] Date of Patent: Dec. 26, 2000

[54] SOCKET FOR INTEGRATED CIRCUIT CHIP

[75] Inventor: Jonathan Wayne Goodwin, Braintree, Mass.

[73] Assignee: Thomas & Betts International, Inc., Sparks, Nev.

[21] Appl. No.: 09/082,720

[22] Filed: May 21, 1998

Related U.S. Application Data

[60] Provisional application No. 60/074,768, Feb. 17, 1998.

[51] Int. Cl.[7] ....................................................... H01R 9/09
[52] U.S. Cl. ................................................................ 439/70
[58] Field of Search .................................. 439/66, 71, 72, 439/73, 91, 564, 573, 525, 526

[56] References Cited

U.S. PATENT DOCUMENTS

| | | | |
|---|---|---|---|
| 5,161,983 | 11/1992 | Ohno et al. . | |
| 5,215,472 | 6/1993 | DelPrete et al. | 439/71 |
| 5,221,209 | 6/1993 | D'Amico . | |
| 5,362,985 | 11/1994 | Ma et al. | 257/707 |
| 5,611,654 | 3/1997 | Frattarola et al. | 411/432 |
| 5,702,256 | 12/1997 | Severn | 439/71 |
| 5,713,744 | 2/1998 | Lamb | 439/66 |
| 5,905,416 | 5/1999 | Shimid et al. | 333/134 |

FOREIGN PATENT DOCUMENTS 0220600   6/1987   European Pat. Off. .

*Primary Examiner*—Kheim Nguyen
*Assistant Examiner*—J. F. Duverne
*Attorney, Agent, or Firm*—Weingarten, Schurgin, Gagnebin & Hayes LLP

[57] ABSTRACT

A three point alignment feature facilitates alignment of an integrated circuit chip relative to a socket that is mounted on a printed circuit board 14. The socket includes four walls that define a rectangle in which the integrated circuit chip is mounted. A first contact point 28 extends inward from a first one 22 of the walls. Second and third contact points 30, 32 extend inward from a second one 20 of the walls, which adjoins the first wall. A first force is applied against the integrated circuit chip from a third one 18 of the walls, which is parallel with the first wall. Second and third forces are applied against the integrated circuit chip from a fourth one 16 of the walls, which is parallel with the second wall. Hence, the integrated circuit chip is aligned in a corner defined by the first and second walls, and is oriented by the three contact points. Spring members 34, 36, 38, 40 may be employed to provide the first, second and third forces. Another alignment feature is employed to facilitate alignment of the socket with respect to the printed circuit board. Further, captive hardware fasteners may be employed to attache the socket to the printed circuit board.

7 Claims, 4 Drawing Sheets

SECTION 6 - 6

SECTION 8-8

SOCKET FOR INTEGRATED CIRCUIT CHIP

CROSS REFERENCE TO RELATED APPLICATIONS

A claim of priority is made to U.S. Provisional Patent Application No. 60/074,768, filed Feb. 17, 1998, entitled SOCKET FOR MOUNTING AN INTEGRATED CIRCUIT CHIP.

STATEMENT REGARDING FEDERALLY SPONSORED RESEARCH OR DEVELOPMENT

Not applicable

BACKGROUND OF THE INVENTION

The present invention is generally related to mounting an integrated circuit chip on a printed circuit board, and more particularly to a socket that facilitates mounting and alignment of an integrated circuit chip on a printed circuit board.

Sockets for mounting electronic devices such as integrated circuit chips on a printed circuit board are known. The socket may be mounted to the printed circuit board, while the integrated circuit chip is snap-fitted into the socket. One advantage of this arrangement is that, unlike integrated circuit chips that are soldered directly on the printed circuit board, an integrated circuit chip that is mounted in a socket can be easily disconnected from the printed circuit board for testing and replacement. However, the relatively dense layout and small size of electrical contacts on some integrated circuit chips necessitates precise alignment both between the socket and the printed circuit board, and between the integrated circuit chip and the socket.

BRIEF SUMMARY OF THE INVENTION

In accordance with the present invention, an integrated circuit alignment feature facilitates alignment of an integrated circuit chip relative to a socket, and a socket alignment feature facilitates alignment of the socket relative to a printed circuit board. The socket includes four walls that define a rectangular frame in which the integrated circuit chip is mounted. A first alignment contact point extends inward relative to a first one of the walls. Second and third alignment contact points extend inward from a second one of the walls, which adjoins the first wall. A first force is applied against the integrated circuit chip from a third one of the walls, which is parallel with the first wall. Second and third forces are applied against the integrated circuit chip from a fourth one of the walls, which is parallel with the second wall. Hence, the integrated circuit chip is aligned in a corner defined by the first and second walls, and is oriented by the three alignment contact points. Spring members may be employed to provide the first, second and third forces.

The socket alignment feature includes first and second alignment posts that are disposed proximate to opposing corners of the socket. The first alignment post provides a point around which the socket can be rotated when the first alignment post is fitted into a receiver hole in the printed circuit board. The second alignment post secures the socket in position at one point in the circle of rotation defined by the first alignment post. In the illustrated embodiment, the first alignment post has a triangular shaped cross-section and the second alignment post has a diamond-shaped quadrilateral cross-section.

The socket may be secured to the printed circuit board with captive hardware fasteners that facilitate application of constant, known force to secure the socket against the printed circuit board. Each fastener includes a head and a shaft on which a spring member is retained. The spring is retained by forming a channel in the shaft of the fastener where the shaft and head portions meet. At least one turn of the spring member is retained in the channel, thereby securing the spring to the fastener. A retaining washer may be disposed at one end of the spring such that the spring is disposed between the head of the fastener and the retaining washer. The retaining washer functions to hold the spring in compression relative to the free length of the spring. Use of the retaining washer enables application of higher spring force with a shorter shaft length.

BRIEF DESCRIPTION OF THE SEVERAL VIEWS OF THE DRAWING

The foregoing features of the invention, as well as the invention itself, may be more fully understood from the following Detailed Description of the Invention, and Drawing, of which.

DETAILED DESCRIPTION OF THE INVENTION

U.S. Provisional Patent Application No. 60/074,768, filed Feb. 17, 1998, entitled SOCKET FOR MOUNTING AN INTEGRATED CIRCUIT CHIP is incorporated herein by reference.

Figure 1:
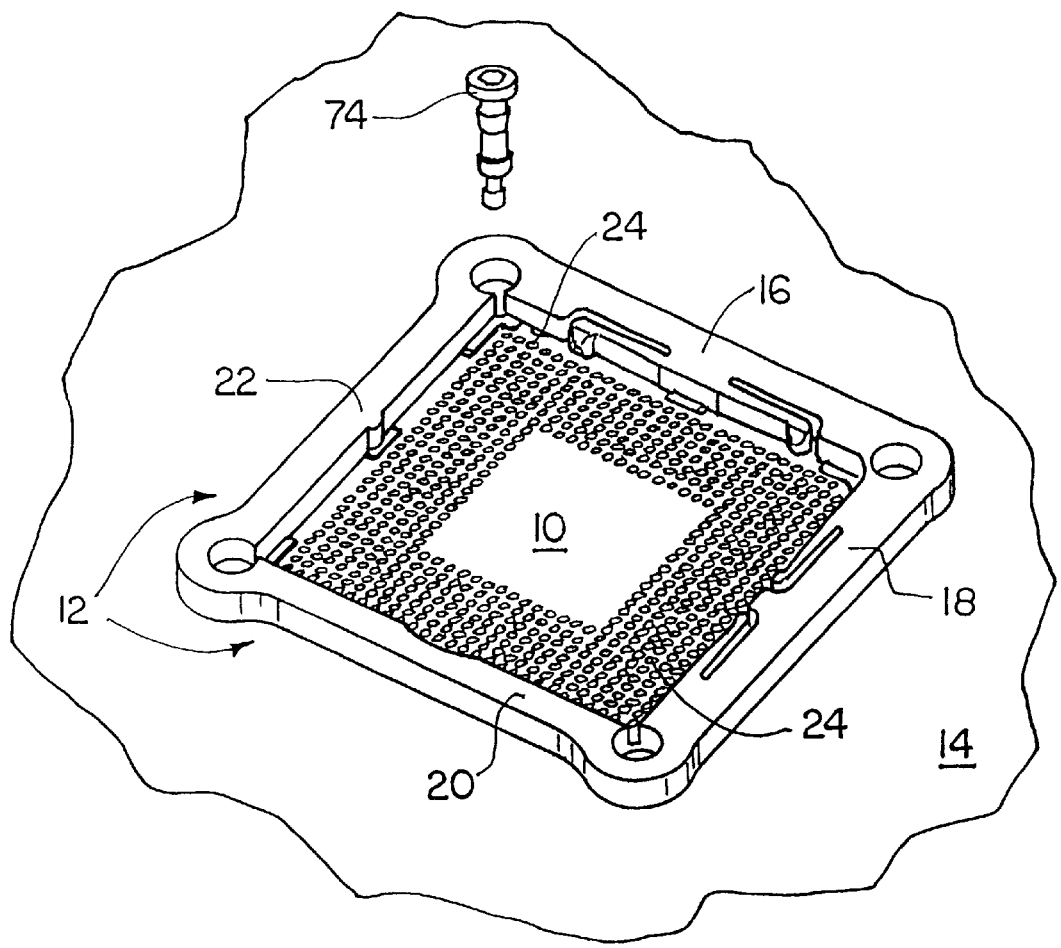
FIG. 1 is a perspective view of a socket for mounting an integrated circuit chip on a printed circuit board.

Referring to FIG. 1, the socket includes a base 10 and an enclosing frame 12. The base 10 is a thin, flat wall. The bottom of the base 10 is disposed against the surface of a printed circuit board 14. The frame 12 includes four walls including a first wall 22, a second wall 20, a third wall 18, and a fourth wall 16 that are disposed along the edges of the base 10. An integrated circuit chip is mounted in the socket by placing the chip in the recess formed between the walls and the base. In the illustrated embodiment, the socket is constructed as a single structure.

Figure 2:
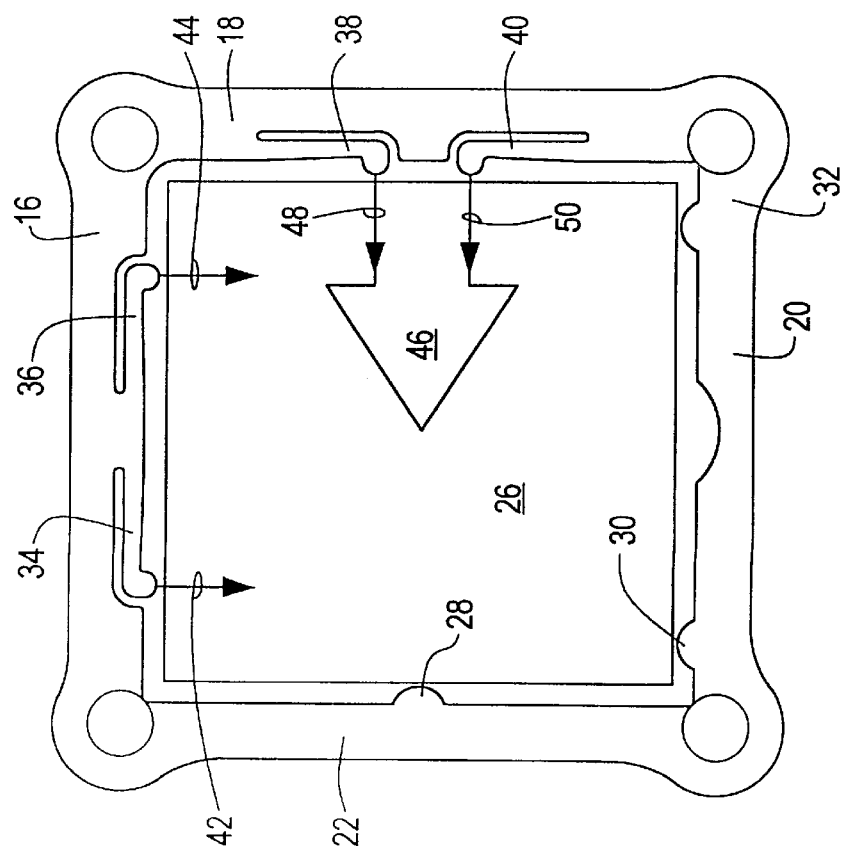
FIG. 2 is a plan view of the socket of FIG. 1 with an integrated circuit chip mounted therein.

Referring to FIGS. 1 and 2, resilient electrical interconnects 24 are disposed in holes formed in the base 10 to facilitate electrical contact between a mounted integrated circuit chip 26 and the printed circuit board 14. An array of contacts 25 is disposed on the bottom surface of the integrated circuit chip. A corresponding array of holes is formed in the base 10. The resilient electrical interconnects 24 are then disposed in the holes formed in the base. In the illustrated example, the resilient interconnects are selected from varieties known in the art such as grafted metalized particle interconnects ("GMPI") and homogenous metalized particle interconnects ("MPI") that are formed by combining a resilient material such as silicon with conductive metallic particles such as carbon. Once placed in the holes in the base 10, the resilient interconnects 24 form an interface between corresponding contacts on the printed circuit board 14 on which the socket is mounted and the integrated circuit chip 26 that is mounted in the socket.

Referring to FIG. 2, integrated circuit chip alignment features are formed on selected ones of the walls of the frame to facilitate alignment of the integrated circuit chip 26 in the recess in the socket. In particular, the alignment features align the integrated circuit chip relative to the resilient interconnects that are disposed in the base. In the illustrated embodiment, the alignment features include three position-defining contact points 28, 30, 32 and four spring members 34, 36, 38, 40 that are disposed on the walls of the frame. Contact points 30 and 32 extend inward from wall 20, and contact point 28 extends inward from wall 22. Spring members 34 and 36 are disposed on wall 16 and spring members 38 and 40 are disposed on wall 18.

The spring members operate to position the integrated circuit chip relative to the position defining contact points. The spring members 34, 36, 38, 40 apply force against the integrated circuit chip 26 to establish and maintain contact between the integrated circuit chip and each of the contact points 28, 30, 32. Spring member 34 applies a force vector 42 that originates proximate to the corner defined by wall 16 and wall 22, and is perpendicular to wall 16, to establish and maintain contact between the integrated circuit chip 26 and contact point 30, which is proximate to the corner defined by wall 22 and wall 20. Similarly, spring member 36 applies a force vector 44 that originates proximate to the corner defined by wall 16 and wall 18, and perpendicular to wall 16, to establish and maintain contact between the integrated circuit chip 26 and contact point 32, which is proximate to the corner defined by wall 18 and wall 20. Spring member 38 and spring member 40 operate in concert to apply a force vector 46 that represents the combination of force vectors 48 and 50, originating proximate to the center of wall 18, and is perpendicular to wall 18, to establish and maintain contact between the integrated circuit chip 26 and contact point 28, which is proximate to the center of wall 22. Hence, force vectors 42, 44 and 46 operate to align the integrated circuit chip relative to contact points 28, 30, 32 in the corner defined by wall 20 and wall 22.

Figure 3:
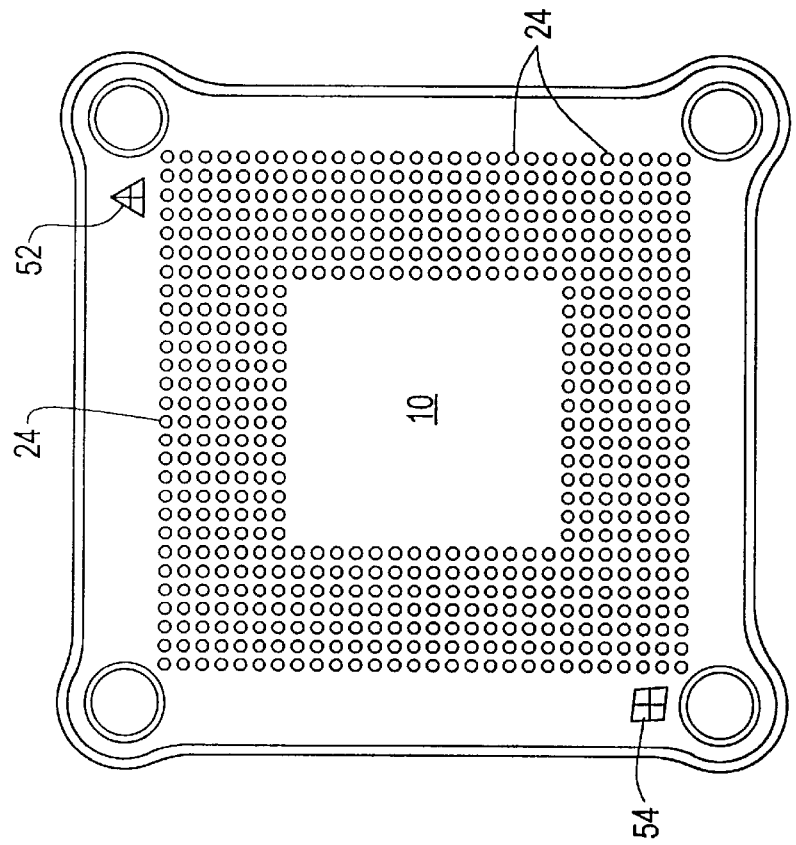
FIG. 3 is a bottom view of the socket of FIG. 1.
Figure 4:
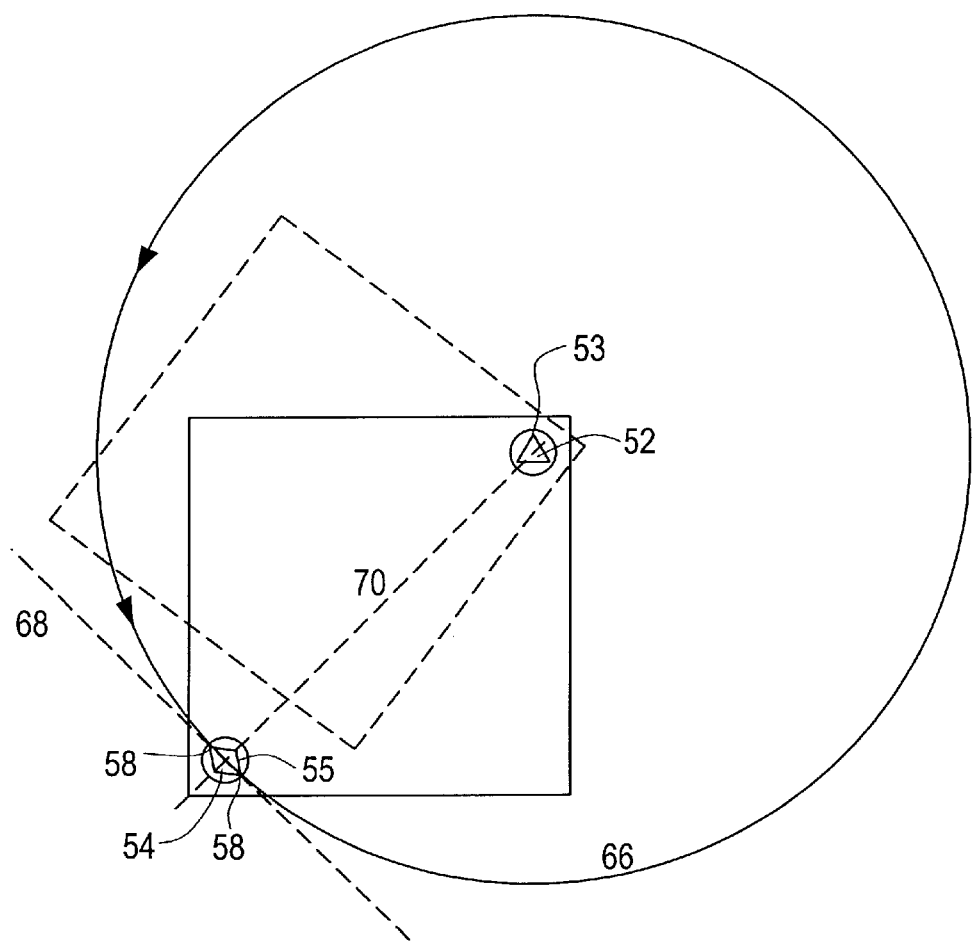
FIG. 4 is a bottom view of the socket that illustrates operation of the socket alignment features.
Figure 5:
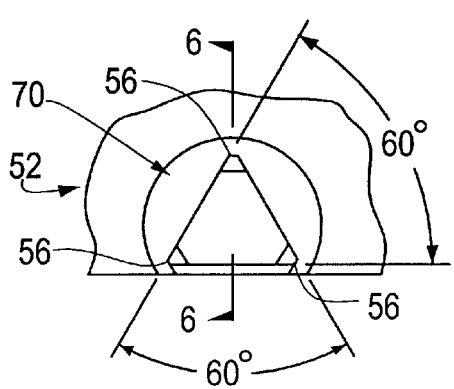
FIG. 5 is a plan view of the triangular alignment feature.
Figure 6:
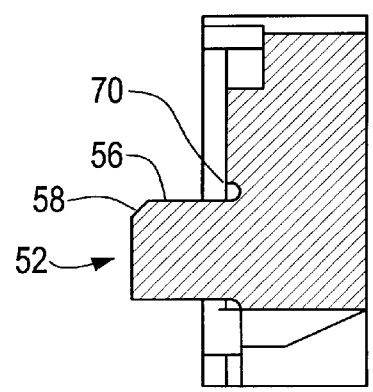
FIG. 6 is a cross sectional view of the triangular alignment feature of FIG. 5.
Figure 7:
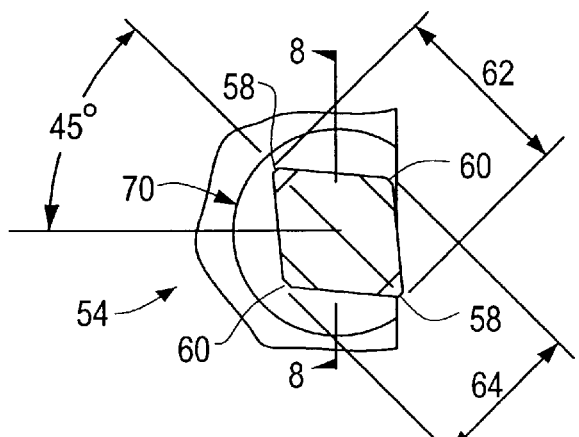
FIG. 7 is a plan view of the quadrilateral alignment feature.
Figure 8:
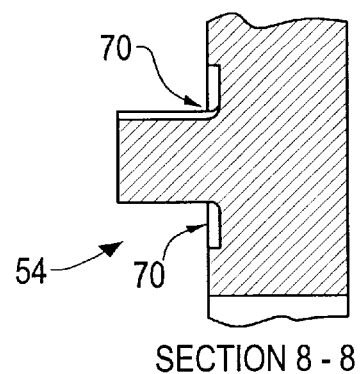
FIG. 8 is a cross sectional view of the quadrilateral alignment feature of FIG. 7.

Referring to FIGS. 3 and 4, alignment features are formed on the bottom of the socket to facilitate alignment of the socket with respect to the printed circuit board. In particular, the alignment features align the resilient interconnects 24 that are disposed in the base 10 relative to contact pads formed on the surface of the printed circuit board. In the illustrated embodiment, the alignment features include two posts 52, 54 that are inserted into holes formed in the printed circuit board. In particular, the posts 52, 54 are press fitted into the holes in the printed circuit board.

The first and second posts 52, 54 define polar alignment coordinates for the socket. A center of rotation is defined by the first post 52. In particular, when the first post 52 is inserted into the corresponding hole, or first receiver 53 in the printed circuit board, the socket is rotatably movable around the first post 52. A position in the rotation is defined by the second post 54. When the second post 54 is inserted into the corresponding hole, or second receiver 55 in the printed circuit board, the socket is no longer rotatably movable around the first post 52. In the embodiment illustrated in FIGS. 3–6, the first post 52 has a triangular cross section. In particular, the post 52 has an equilaterally triangular cross-section such that the acute angle defined by each adjoining edge 56 is approximately 60 degrees. The holes in the printed circuit board contact the post 52 at each of the three edges 56, thereby securing the socket to the printed circuit board while allowing rotation about the center of the post 52. Portions 58 of the edges 56 of the post 52 are chamfered to facilitate press fitting the post into the hole in the printed circuit board.

In the embodiment illustrated in FIGS. 3, 4, 7 and 8, the second post 54 has a quadrilateral cross-section. In particular, the post 54 has an equilaterally quadrilateral cross-section that is roughly "diamond-shaped," with two opposing edges 58 extending further from the center of the post than the other two opposing edges 60. In other words, the distance 62 between edges 58 is greater than the distance 64 between edges 60. The post 54 is oriented on the socket to secure and align the socket at a predetermined position within the circle of rotation 66 defined by post 52. A line 68 between edges 58 is tangential to the circle of rotation 66, and hence perpendicular to a line 70 from the center of post 52 to the center of post 54. The holes in the printed circuit board contact the post 54 at edges 58, thereby securing the socket to the printed circuit board while disallowing rotation about the center of post 52. Portions of the edges 58, 60 of the post 54 are chamfered to facilitate press fitting the post into the hole in the printed circuit board. Further, a recessed area 72 may be formed at the base of post 54, and post 52 (FIG. 6), to accommodate material that is peeled away from an edge when the posts are inserted into the holes in the printed circuit board.

Figure 9:
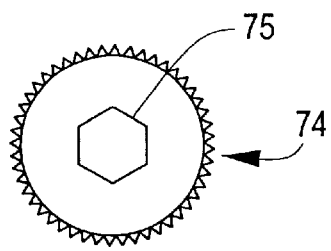
FIG. 9 is a plan view of the fastener that is employed to secure the socket to the printed circuit board.
Figure 10:
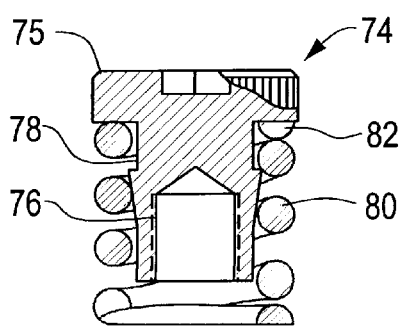
FIG. 10 is a cross sectional view of the fastener of FIG. 9.

Referring now to FIGS. 1, 9 and 10, the socket may be secured to the printed circuit board 14 with a captive hardware fastener 74 that facilitates application of constant, known force to secure the socket against the printed circuit board. The fastener 74 may be a cap nut or shoulder screw with a head 75 and a shaft 76. The shaft 76 includes a recessed channel 78 located where the shaft meets the head. The channel facilitates retention of a spring member 80. At least one turn 82 of the spring member 80 has a diameter that is less than the diameter of the shaft and is retainable inside the recessed channel, thereby securing the spring to the fastener.

Figure 11:
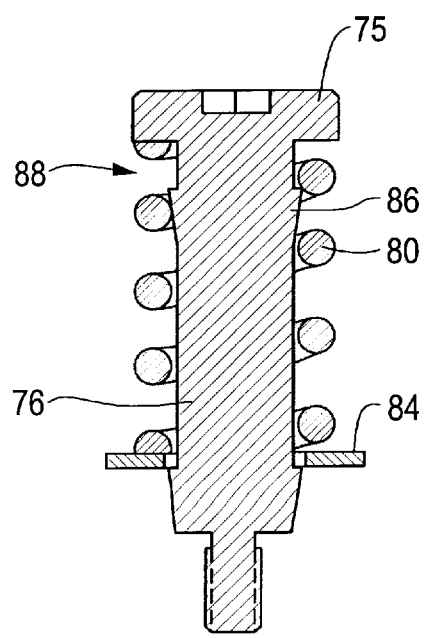
FIG. 11 illustrates an alternative embodiment of the fastener.

In an alternative embodiment illustrated in FIG. 11, a retaining washer 84 is disposed at one end of the spring 80 such that the spring is disposed between the head 75 of the fastener and the retaining washer 84. The retaining washer 84 functions to hold the spring 80 in compression relative to the free length of the spring. Use of the retaining washer enables application of higher spring force with a shorter shaft 76 length.

A beveled flange 86 may be employed to retain the spring 80. The beveled flange has a diameter that is greater than the diameter of the shaft 76 of the fastener. Hence, a channel 88 is formed between the beveled flange and the head 75 of the fastener. Further, the diameter of the channel 88 may be less than, equal to or greater than the diameter of the shaft.

Having described the embodiments consistent with the present invention, other embodiments and variations consistent with the present invention will be apparent to those skilled in the art. Therefore, the invention should not be viewed as limited to the disclosed embodiments but rather should be viewed as limited only by the spirit and scope of the appended claims.

What is claimed is:

1. A socket for mounting an integrated circuit chip on a printed circuit board, comprising:

a base having a plurality of edges and at least one interconnect for providing connection to the printed circuit board;

a first wall disposed along one of the edges of the base;

a second wall disposed along one of the edges of the base, said second wall being abutted to and perpendicular to said first wall;

a third wall disposed along one of the edges of the base, said third wall being abutted to and perpendicular to said second wall;

a fourth wall disposed along one of the edges of the base, said fourth wall being abutted to and perpendicular to said first wall and said third wall;

a first alignment pad disposed on said first wall, extending inward from said first wall toward said third wall;

second and third alignment pads disposed on said second wall, extending inward from said second wall toward said fourth wall;

a first force applicator including a plurality of members that applies a first force vector that is perpendicular to said first wall in a direction from said third wall toward said first wall; and a second force applicator including a plurality of members that applies a second force vector that is perpendicular to said second wall in a direction from said fourth wall toward said second wall, whereby the integrated circuit chip, which is disposed against the base, is aligned against said alignment pads.

2. The socket of claim 1 wherein said second force applicator includes first and second spring members which provide complementary force vectors that combine to provide said second force vector.

3. The socket of claim 2 wherein said first force applicator includes third and fourth spring members.

4. The socket of claim 1 wherein said first alignment pad is centrally disposed on said first wall.

5. The socket of claim 4 wherein said first force applicator applies force from a center portion of said third wall.

6. The socket of claim 5 wherein said second alignment pad is located proximate to a corner defined by said first and second walls.

7. The socket of claim 6 wherein said third alignment pad is disposed proximate to a corner defined by said second and third walls.

* * * * *